(12) United States Patent
Sonnekalb (10) Patent No.: US 11,010,296 B2
(45) Date of Patent: May 18, 2021

(54) TEMPORARILY STORING MEMORY CONTENTS

(71) Applicant: Infineon Technologies AG, Neubiberg (DE)

(72) Inventor: Steffen Sonnekalb, Munich (DE)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 16/167,985

(22) Filed: Oct. 23, 2018

(65) Prior Publication Data

US 2019/0121736 A1 Apr. 25, 2019

(30) Foreign Application Priority Data

Oct. 24, 2017 (DE) .......................... 102017124805.6

(51) Int. Cl.

| | |
|---|---|
| *G06F 12/08* | (2016.01) |
| *G06F 12/0808* | (2016.01) |
| *G11C 7/24* | (2006.01) |
| *G11C 7/10* | (2006.01) |
| *G06F 11/10* | (2006.01) |
| *G06F 12/0815* | (2016.01) |
| *G06F 13/16* | (2006.01) |
| *G11C 29/52* | (2006.01) |

(52) U.S. Cl.
CPC ...... *G06F 12/0808* (2013.01); *G06F 11/1004* (2013.01); *G06F 12/0815* (2013.01); *G06F 13/1673* (2013.01); *G11C 7/1006* (2013.01); *G11C 7/24* (2013.01); *G11C 29/52* (2013.01)

(58) Field of Classification Search
CPC ............ G06F 13/1673; G06F 11/1004; G06F 12/0815; G06F 11/10; G06F 12/0808; G06F 13/16; G11C 7/24; G11C 7/1006; G11C 29/52
USPC ................................................. 711/137, 141
See application file for complete search history.

(56) References Cited

U.S. PATENT DOCUMENTS

| | | | | |
|---|---|---|---|---|
| 5,913,021 A | * | 6/1999 | Masubuchi | ......... G06F 12/0831 711/141 |
| 6,148,416 A | * | 11/2000 | Masubuchi | ......... G06F 11/1407 714/15 |
| 2007/0130442 A1 | * | 6/2007 | Lee | ......... G06F 3/0656 711/207 |
| 2010/0318754 A1 | * | 12/2010 | Park | ......... G06F 3/0616 711/156 |
| 2011/0208898 A1 | * | 8/2011 | Shin | ......... G06F 12/0246 711/103 |
| 2015/0058531 A1 | * | 2/2015 | Yeh | ......... G06F 12/0246 711/103 |
| 2016/0239237 A1 | * | 8/2016 | Gong | ......... G06F 40/166 |

(Continued)

*Primary Examiner* — Pierre Miche Bataille
(74) *Attorney, Agent, or Firm* — Schiff Hardin LLP (57) ABSTRACT

A memory arrangement having a memory, a first buffer memory, a first buffer memory controller which, during the storage of memory contents from the memory in the first buffer memory, is configured to invalidate the memory contents in the memory by means of a modification, a second buffer memory and a second buffer memory controller which is configured to read memory contents from the memory, to check whether the memory contents read from the memory are valid and, if the memory contents read from the memory are invalid, to apply a reversal of the modification to the read memory contents.

20 Claims, 5 Drawing Sheets

(56) References Cited

U.S. PATENT DOCUMENTS

2017/0060439 A1* 3/2017 Harasawa ............. G06F 3/0679
2019/0251029 A1* 8/2019 Steinmacher-Burow ....................
G06F 12/0808

* cited by examiner

TEMPORARILY STORING MEMORY CONTENTS

Example embodiments generally relate to memory arrangements and methods for temporarily storing memory contents.

Electronic devices must be protected against attacks in a multiplicity of applications. A typical example concerns chip cards which process and store secret data (e.g. keys or passwords) or data which are intended to be protected against manipulation (e.g. credit on a credit card), or control devices, for example in a vehicle, the correct function of which is important for the safety of the user. One possible point of attack of an electronic device is its memory which an attacker can manipulate in order to gain knowledge of secret data or impair the correct function of the electronic device. Efficient mechanisms to protect electronic memories, in particular memory contents, are therefore desirable.

According to one embodiment, a memory arrangement is provided which has a memory, a first buffer memory, a first buffer memory control unit which, during the storage of memory contents from the memory in the first buffer memory, is configured to invalidate the memory contents in the memory by means of a modification (e.g. by modifying useful data in relation to their checksum), a second buffer memory and a second buffer memory control unit which is configured to read memory contents from the memory, to check whether the memory contents read from the memory are valid and, if the memory contents read from the memory are invalid, to apply a reversal of the modification to the read memory contents.

According to a further embodiment, a method is provided for temporarily storing memory contents according to the memory arrangement described above.

The figures do not reflect the actual size ratios, but are intended to serve to illustrate the principles of the different example embodiments. Different example embodiments are described below with reference to the following figures.

The following detailed description relates to the attached figures which show details and example embodiments. These example embodiments are described in such detail that the person skilled in the art can implement the invention. Other embodiments are also possible and the example embodiments can be modified in structural, logical and electrical terms without deviating from the subject-matter of the invention. The different example embodiments are not necessarily mutually exclusive, but rather different embodiments can be combined with one another to produce new embodiments. In the context of this description, the terms "linked", "connected" and "coupled" are used to describe both a direct and an indirect link, a direct or indirect connection, and a direct or indirect coupling.

Buffer memories, typically referred to as caches or cache memories, are typically used to compensate for a relatively slow access to a memory.

Figure 1:
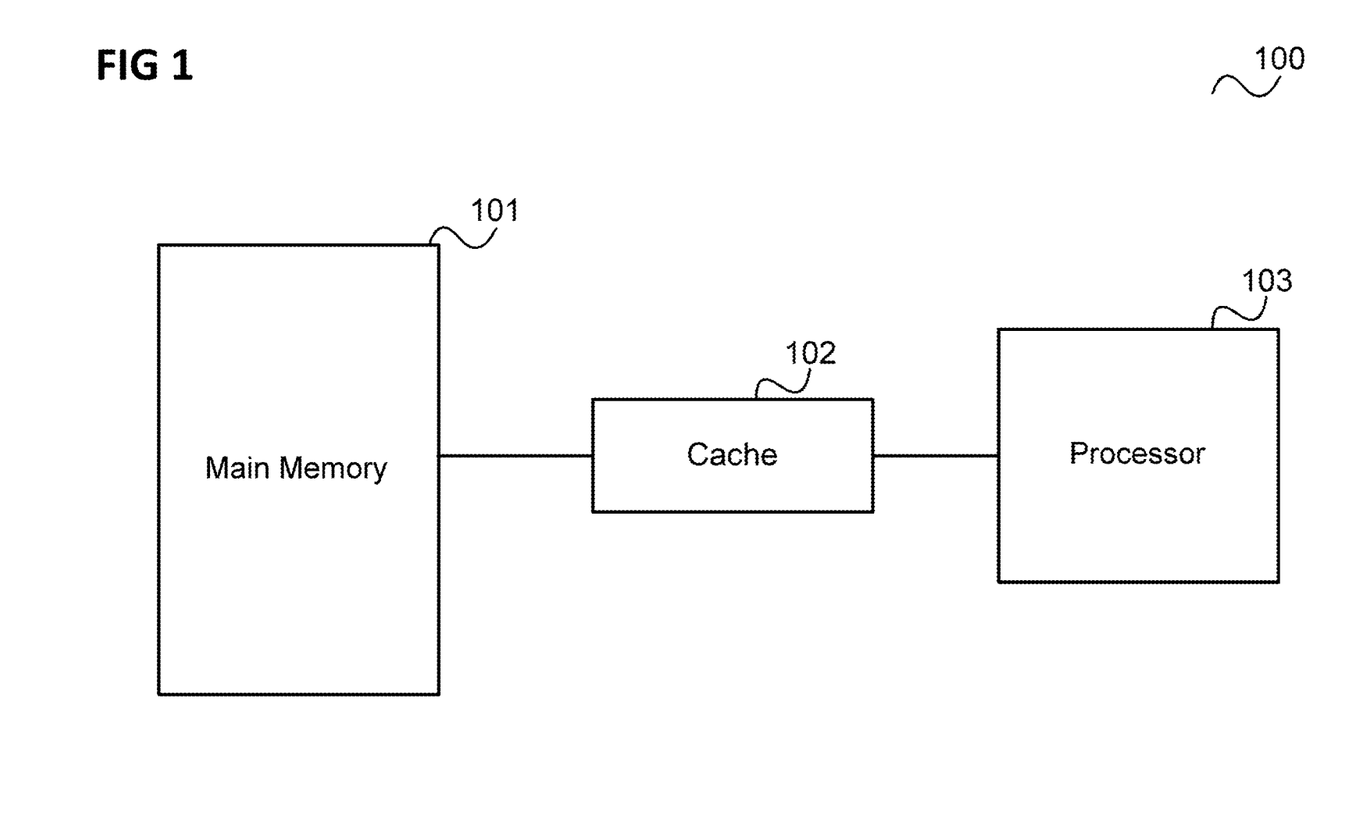
FIG. 1 shows a data processing device with a main memory, a cache memory and a processor.

FIG. 1 shows a data processing device 100 with a main memory 101, a cache memory 102 and a processor 103.

The processor 103 accesses the main memory 101 and reads instructions (program code) and data to be processed from the main memory 101. However, the processor 103 can be so fast that it processes data and instructions (commands) faster than the main memory 101 can supply commands and data. The cache memory 102 is therefore provided in which memory contents from the main memory are temporarily stored in blocks which the processor can access more quickly in the cache memory 102 than in the main memory due to the higher access speed.

If the data processing device 100 is a security controller in which variable data are transported from an original memory (e.g. the main memory 101, for example a RAM (Random Access Memory)) into a different memory (e.g. the cache 102), it may be necessary to make the original data unusable in the main memory 101 following the transport by means of a destructive readout. It is thereby enforced that only one instance of the data exists in each case in the system (consisting of the main memory and cache). This prevents attacks which are aimed at an erroneous access to a different (i.e. older) version of the data.

However, there are scenarios in which original data are intended to be destroyed from the perspective of a first buffer memory, but the original data are still intended to be legible from the perspective of a second buffer memory. One example of this is a system with a data cache and an instruction cache that is separate from it.

Figure 2:
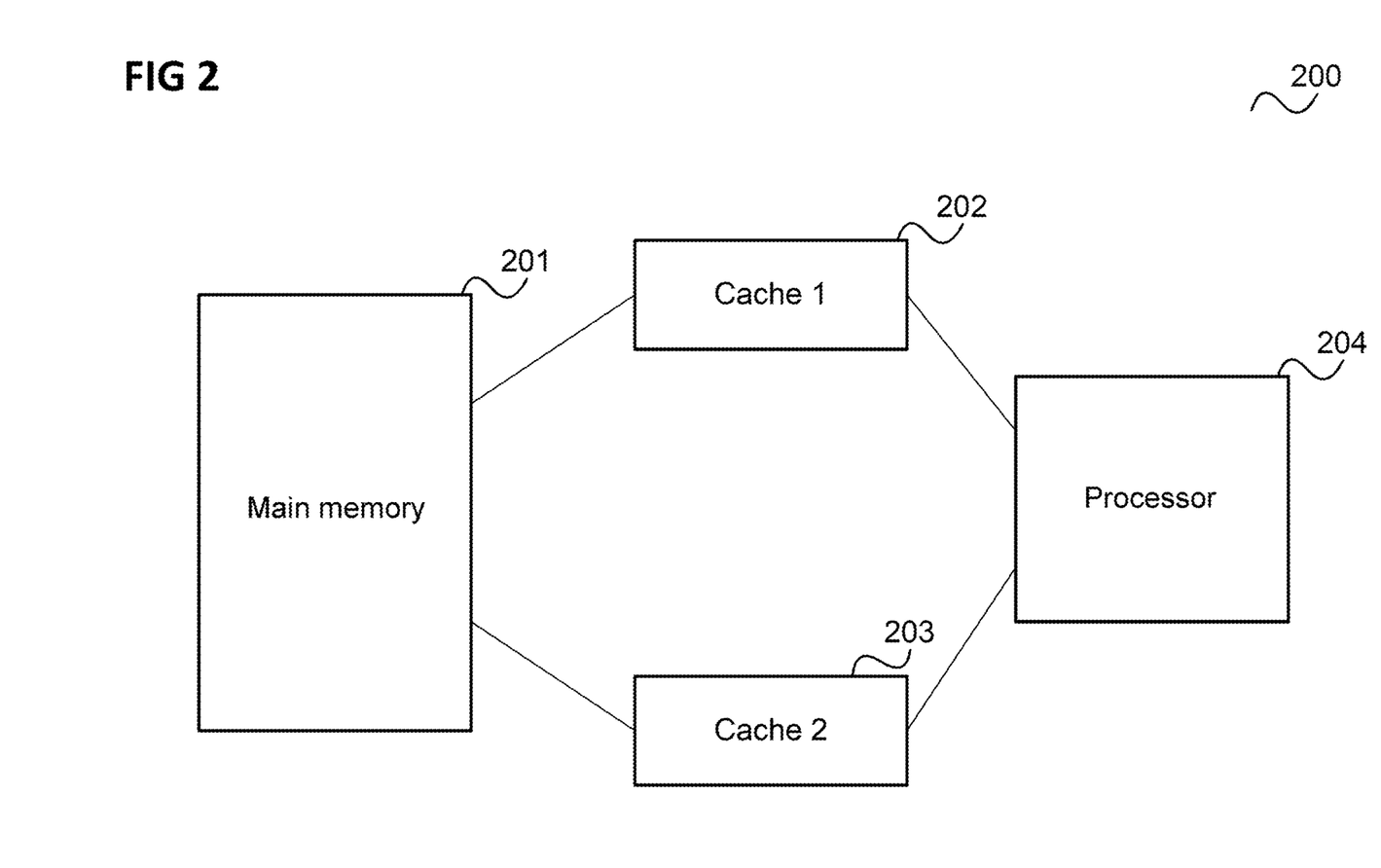
FIG. 2 shows a data processing device with a main memory, two cache memories and a processor.

FIG. 2 shows a data processing device 200 with a main memory 201, a first cache memory 202, a second cache memory 203 and a processor 204.

As in the example shown in FIG. 1, the processor 204 accesses the main memory 201 and reads instructions (program code) and data to be processed from the main memory 201.

In contrast to FIG. 1, however, two cache memories 202, 203 are provided. The first cache memory 202 is, for example, a data cache memory for temporarily storing ("caching") data to be processed and the second cache memory 203 is an instruction cache memory for temporarily storing instructions (program code).

If program code and data to be processed are present in combined form in the main memory 201, i.e. data blocks exist which contain both program code and data to be processed, as in the case of specific architectures (e.g. where literals are used), and, if the cache memories 202, 203 load memory contents (as is customary) in blocks, it is necessary for the same data blocks to remain readable and loadable for both cache memories 202, 203.

This can be achieved by dispensing completely with the destructive readout, but this makes the system vulnerable to attacks.

Another possibility is for the first cache memory 202 (i.e. the cache memory which reads first from the memory) initially to write the memory contents back to the original memory 201 before the second cache memory 203 can read them from there. However, this requires knowing whether the memory contents are actually present in the first cache memory 202, which results in a high system complexity and significant performance losses due to the necessary copying.

According to different embodiments, a reversible destructive readout is carried out during the storage of memory contents from the main memory 201 in the first cache memory 202.

This enables the original memory contents to be restored once more during the reading of the memory contents into the second cache memory 203 with knowledge of the reversal rule for the reversible destructive readout which was initiated by the reading into the first cache memory 202.

The destructive readout itself is therefore a data-transforming rather than a data-destroying operation. The transformation (or modification) is chosen, for example, in such a way that it modifies the memory contents as comprehensively as possible and modifies them in a way which is not easily reversible. An inversion thus, for example, provides maximum modification but is easily revocable through reapplication. A modification by means of a non-linear/linear feedback shift register ((N)LFSR) or a suitable cryptographic function similarly enables a significant modification, but cannot then be transformed back by means of the same logic and is therefore less easily reversible.

A modification function, for example, which has to be applied to data repeatedly at relatively frequent intervals until the original data are restored is chosen for the transformation.

The modification of the memory contents and the reversal of the modification of the memory contents are carried out, for example, by cache controllers of the cache memories 202, 203.

Figure 3:
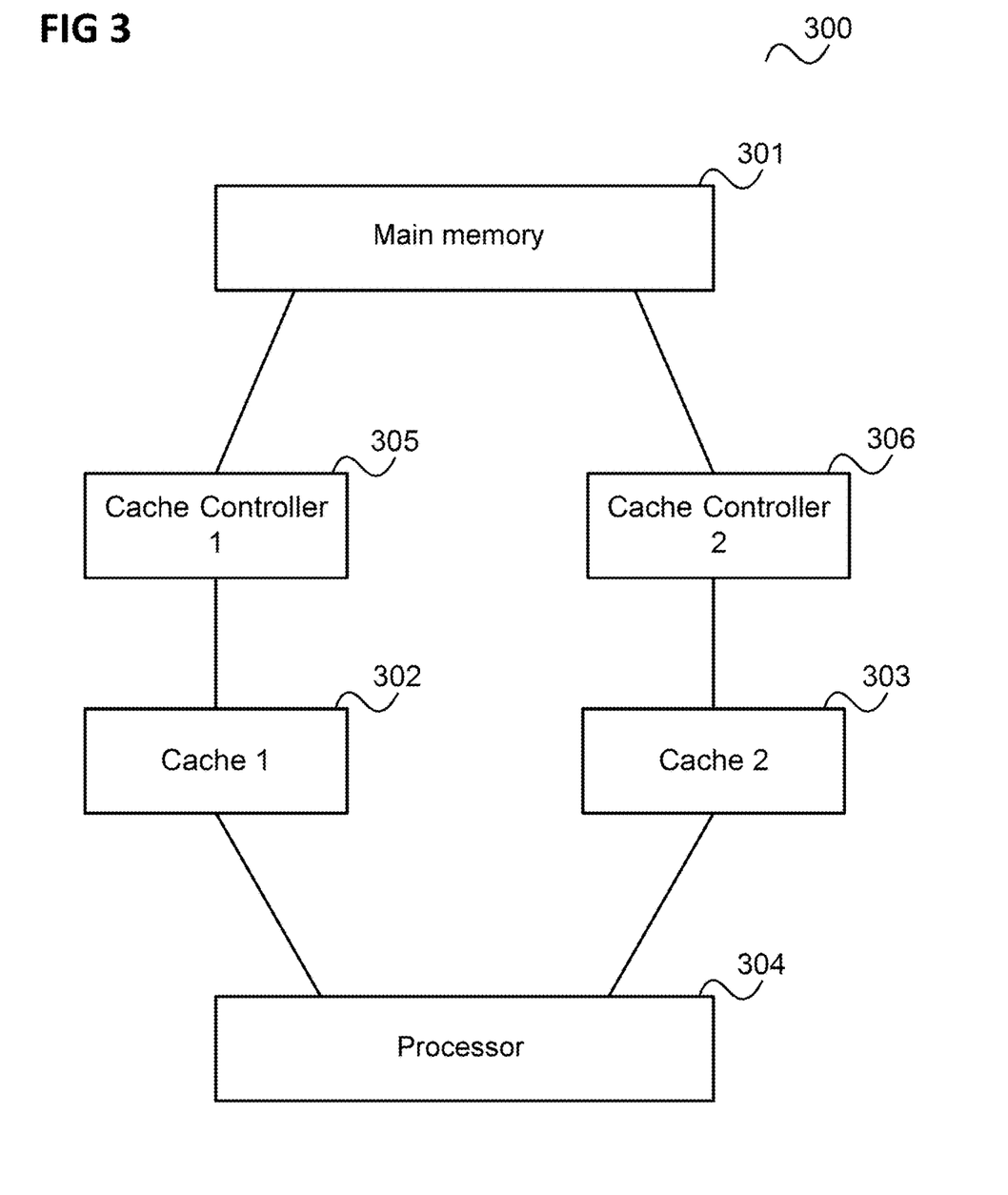
FIG. 3 shows a data processing device with a main memory, two cache memories, associated cache controllers and a processor.

FIG. 3 shows a data processing device 300 with a main memory 301, a first cache memory 302, a second cache memory 303, a processor 304, a first cache controller 305 and a second cache controller 306.

The first cache controller 305 has a memory interface to the main memory 301 and a memory interface to the first cache memory 302 and controls the storage of memory contents from the main memory 301 in the first cache memory 302.

The second cache controller 306 has a memory interface to the main memory 301 and a memory interface to the second cache memory 303 and controls the storage of memory contents from the main memory 301 in the second cache memory 303.

According to one example embodiment, the first cache controller 305 can also store memory contents which are stored in the first cache memory 302 and, for example, have been modified by the processor 304, once more back in the main memory 301. The first cache controller 305 can similarly modify memory contents in the main memory 301 and, for example, invalidate them according to a reversible modification as described above.

Conversely, according to one example embodiment, the second cache controller 306 has read-only access to the main memory 301, i.e. cannot write to the main memory 301 and, in particular, cannot modify any memory contents in the main memory 301.

For the reversible modification of memory contents, the first cache controller 305 can, for example, transform only an error detection code appended to the memory contents (e.g. to a memory word) instead of transforming the entire memory contents.

It can be provided that the first cache controller 305 can only check memory contents for errors for which the error detection code is present in the original (unmodified) state, i.e. it is not capable of compensating for a modification of the error detection code when checking for errors. The reversible modification can thus be irreversible from the perspective of the first cache controller 305, since the first cache controller 305 does not support its reversal. This increases the security of the system.

Conversely, according to one example embodiment, the second cache controller 306, when reading memory contents, including the associated error detection code, for example a memory word, is capable of checking the memory contents for errors not only assuming that the error detection code has not been modified but also assuming that the error detection code has been modified.

If this duplicate check is to be avoided, or if the memory contents (without the error detection code) are themselves part of the reversible modification, a back transformation can be triggered in a targeted manner by the second cache controller 306 by means of supplemented prediction information, e.g. a supplemented prediction bit. If, for example, the cache controller 305 sets a prediction bit of the memory contents which indicates that the memory contents have been reversibly transformed by it and the second cache controller 306, if it reads and detects that the prediction bit (as an example of prediction information) is set, can apply the reversal of the transformation to the memory contents in response thereto. This prediction bit itself generates merely 1-bit security.

A high security and attack detection probability can be constructed through a modification of a sufficient number of bits (e.g. 32 bits or more).

A further approach (if a high security level is not required) consists in marking memory contents as destroyed only by means of an additional auxiliary bit. However, this results in an additional memory requirement and reduced security. The reversible modification (through inversion of the bit) is therefore applied here exclusively to one bit.

The data processing apparatus 300 may, for example, be a security controller which has a data cache memory 302 and an instruction cache memory 303. The main memory 301, is, for example, an external RAM which both caches 302, 303 can access and which stores memory contents having the size of the cache blocks, plus an additional error detection code. A cache block is the unit with which the caches 302, 303 temporarily store. This means that, if a cache 302, 303 is intended to temporarily store a memory content, it reads an entire data block having the size of the cache block from the memory and stores it.

Since data from the RAM 301 can be modified by the processor (CPU) 304 in the data cache 302 through a storage of data (storage operation) and the risk exists that this modification will be lost through reloading of the original data from the RAM 301 (e.g. forced by an attack), according to one example embodiment, the corresponding original data block is subjected to a reversible destructive readout in the RAM 301 during the storage of a data block in the data cache 302. The cache controller 305 of the data cache 302 reversibly modifies the error detection code word (or generally error detection data) of the data block in the RAM 301.

There is no need for the instruction cache 303 to destroy the original data block during the storage of a data block, since it is a read-only cache and therefore no data modification by the CPU 304 is possible here.

If the instruction cache 303 is intended to store a data block which was previously stored by the data cache 302 and was therefore reversibly modified, the cache controller 306 of the instruction cache 303 is capable, according to this embodiment, of checking the data block according to both the undestroyed and the reversibly destroyed (modified) error code of the data block. In order to simplify this, a further bit supplementing the data block can be provided which indicates whether the data block has or has not been reversibly destroyed. The cache controller 305 of the data cache 302 inverts this bit during the destructive readout. It should be noted that, according to different embodiments, a cache controller may generally be a memory controller assigned to the cache which may, for example, also be located in the RAM 301 itself. Similarly, the term "buffer memory control unit" can generally be understood to mean a control unit which is assigned to a buffer memory and performs control tasks for the buffer memory.

The mechanism described above may be used, for example, for a security controller which is implemented as a System on Chip (single chip).

Figure 4:
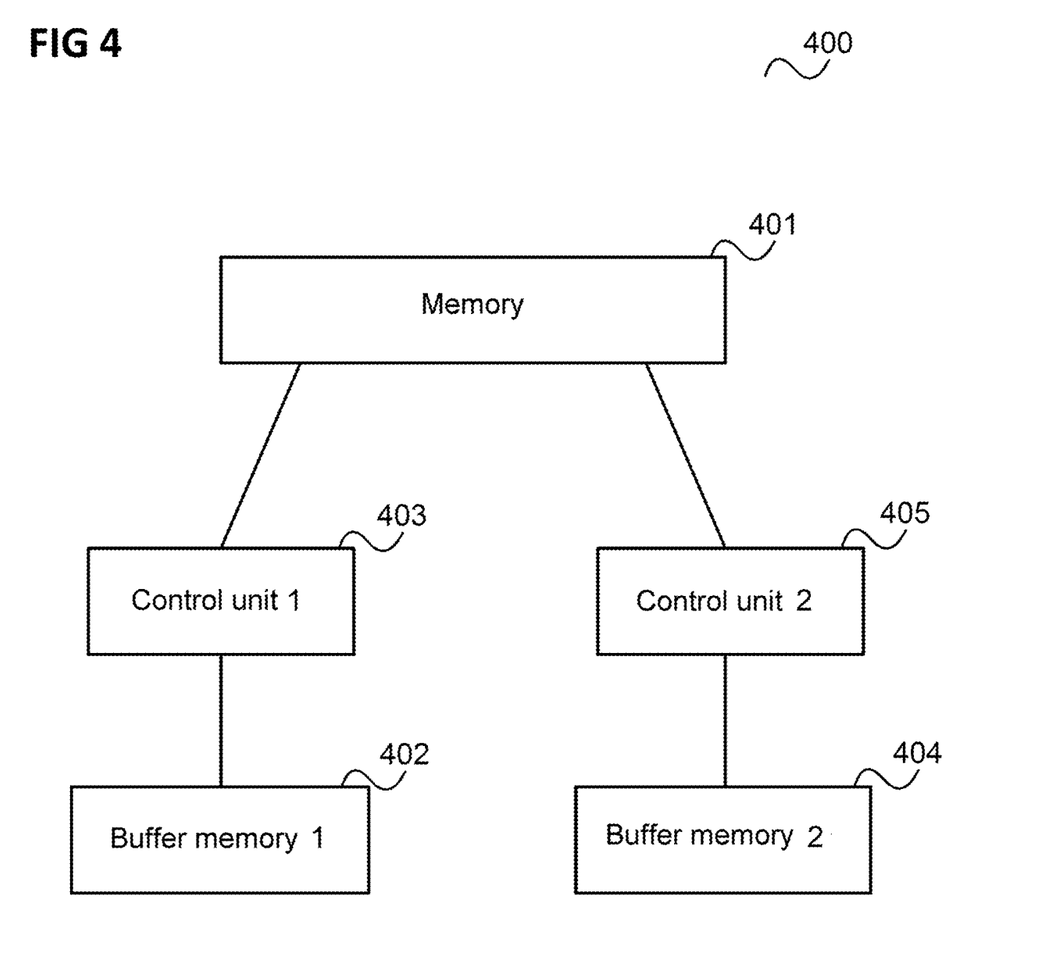
FIG. 4 shows a memory arrangement according to one embodiment.

To summarize, a memory arrangement as shown in FIG. 4 is provided according to different embodiments.

FIG. 4 shows a memory arrangement 400 according to one embodiment.

The memory arrangement 400 has a memory 401, a first buffer memory 402 and a first buffer memory control unit 403 which is configured to invalidate the memory contents in the memory 401 by means of a modification during the storage of memory contents from the memory 401 in the first buffer memory 402.

The memory arrangement 400 furthermore has a second buffer memory 404 and a second buffer memory control unit 405 which is configured to read memory contents from the memory 401, to check whether the memory contents read from the memory 401 are valid and, if the memory contents read from the memory 401 are invalid, to apply a reversal of the modification to the read memory contents.

According to different example embodiments, a first buffer memory (e.g. a cache) or its assigned controller performs a reversible modification of a data block in the memory when it temporarily stores the data block. This serves to prevent the duplicate presence of the same data block in the system (consisting of the memory and buffer memories), which would make it vulnerable to attacks. The reversible modification invalidates the memory contents in the memory 401. The term "invalidates" can be understood here to mean that the memory contents no longer meet a certain test criterion following the modification. The memory contents have, for example, useful data and a checksum, and the useful data or the checksum or both are modified during the modification in such a way that the checksum is no longer the correct checksum for the useful data (e.g. according to a specific error detection code or error correction code according to which the checksum was generated for the useful data before the modification).

The second buffer memory (or its assigned controller) is capable of establishing whether a data block which it is intended to store has been reversibly modified and, if necessary, is capable of compensating for the modification. The second buffer memory can, for example, undo the modification or compensate for it insofar as, if the modification consists in the modification of an error code, it can correctly perform an error detection also using a modified error code.

The memory arrangement 400 corresponds, for example, to the memory of an electronic integrated circuit, for example a chip card (with any given form factor) or a control device (e.g. with a microcontroller), in particular a security controller, e.g. in a vehicle.

The first buffer memory control unit is configured, for example, to control the storage of memory contents in the first buffer memory, and the second buffer memory control unit is configured, for example, to control the storage of memory contents in the second buffer memory.

Figure 5:
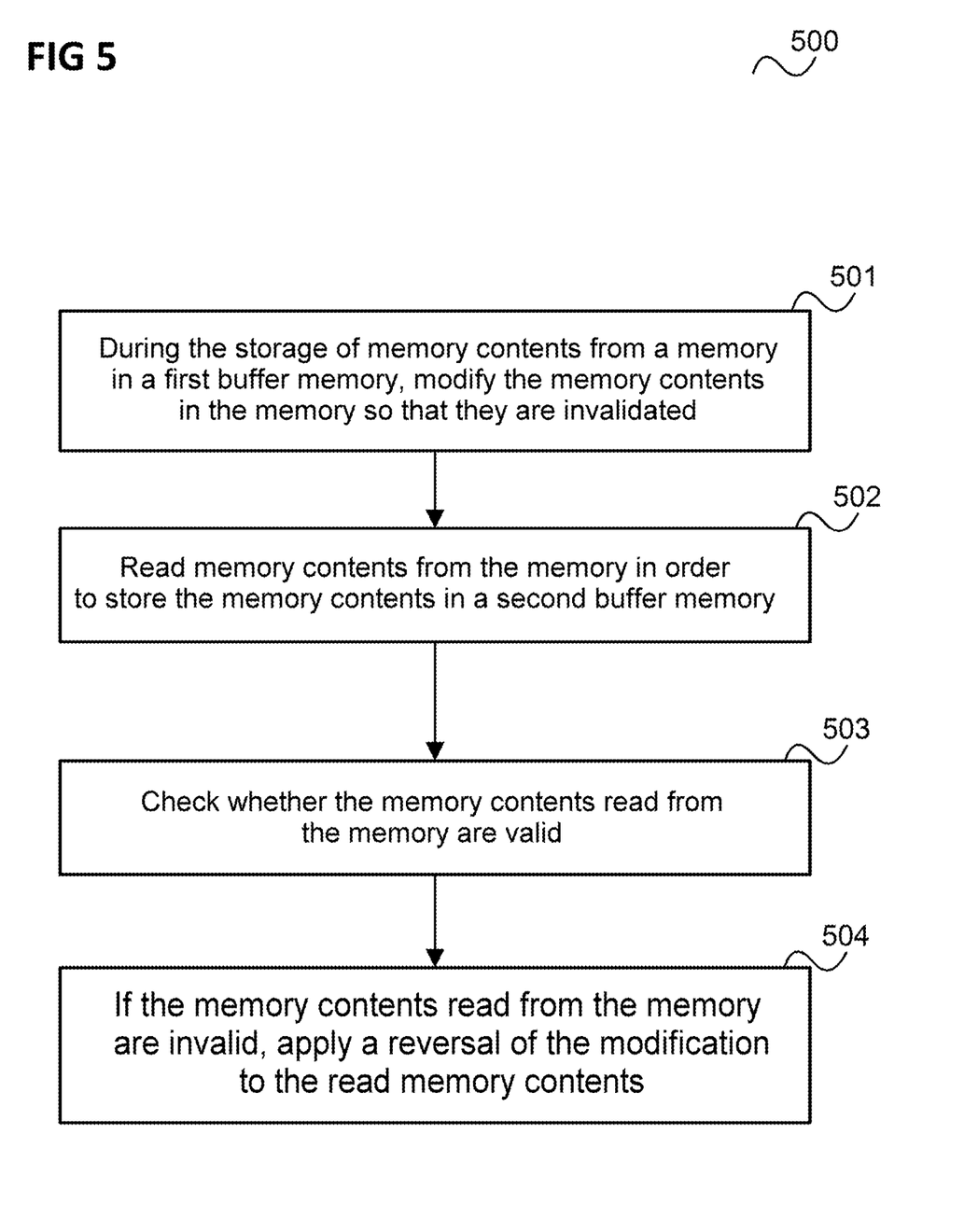
FIG. 5 shows a flow diagram which illustrates a method for temporarily storing memory contents according to one embodiment.

FIG. 5 shows a flow diagram 500 which illustrates a method for temporarily storing memory contents.

In step 501, during the storage of memory contents from a memory in a first buffer memory, the memory contents are modified in the memory so that they are invalidated.

In step 502, the memory contents are read from the memory in order to store the memory contents in a second buffer memory.

In step 503, a check is carried out to determine whether the memory contents read from the memory are valid.

In step 504, a reversal of the modification is applied to the read memory contents if the memory contents read from the memory are invalid.

To summarize, some example embodiments are indicated below.

Example embodiment 1 is a memory arrangement as shown in FIG. 4.

Example embodiment 2 is a memory arrangement according to example embodiment 1, wherein the second buffer memory control unit is configured to store the read memory contents modified by means of the reversal of the modification in the second buffer memory.

Example embodiment 3 is a memory arrangement according to one of example embodiments 1 to 2, wherein the memory contents contain instructions and data to be processed by means of the instructions and the first buffer memory is a buffer memory for providing data to be processed to a processor and the second buffer memory is a buffer memory for providing instructions to the processor.

Example embodiment 4 is a memory arrangement according to one of example embodiments 1 to 3, wherein error code information is stored for the memory contents in the memory and the first buffer memory control unit is configured to invalidate the memory contents in the memory by means of a modification of the stored error code information.

Example embodiment 5 is a memory arrangement according to example embodiment 4, wherein the second buffer memory control unit is configured to check, on the basis of the stored error code information, whether the memory contents read from the memory are valid.

Example embodiment 6 is a memory arrangement according to example embodiment 5, wherein the second buffer memory control unit is configured to check whether the memory contents read from the memory are valid by checking whether the memory contents are error-free according to the stored error code information.

Example embodiment 7 is a memory arrangement according to example embodiment 6, wherein the application of the reversal of the modification comprises checking whether the memory contents are error-free according to error code information resulting from the stored error code information through application of the reversal of the modification.

Example embodiment 8 is a memory arrangement according to one of example embodiments 1 to 7, wherein the memory contents are a data block and the first buffer memory and the second buffer memory temporarily store memory contents in data blocks.

Example embodiment 9 is a memory arrangement according to one of example embodiments 1 to 8, wherein the modification of the memory contents comprises modifying one or more bits of the memory contents or one or more bits of error code information of the memory contents.

Example embodiment 10 is a memory arrangement according to one of example embodiments 1 to 9, wherein the first buffer memory control unit has read and write access to the memory and the second buffer memory control unit has read-only access to the memory.

Example embodiment 11 is a memory arrangement according to one of example embodiments 1 to 10, wherein the modification is irreversible for the first buffer memory control unit and is reversible for the second buffer memory control unit.

Example embodiment 12 is a memory arrangement according to one of example embodiments 1 to 11, wherein a prediction bit which indicates whether the memory contents have been modified is stored for the memory contents in the memory and the first buffer memory control unit is configured to set the prediction bit during the reading or modification of the memory contents.

Example embodiment 13 is a memory arrangement according to example embodiment 12, wherein the second buffer memory control unit is configured to check, on the basis of the stored prediction bit, whether the memory contents read from the memory are valid.

Example embodiment 14 is a method for temporarily storing memory contents, as shown in FIG. 5.

Example embodiment 15 is a method according to example embodiment 14, comprising the storage in the second buffer memory of the read memory contents modified by means of the reversal of the modification.

Example embodiment 16 is a method according to one of example embodiments 14 to 15, wherein the memory contents contain instructions and data to be processed by means of the instructions and the first buffer memory is a buffer memory for providing data to be processed to a processor and the second buffer memory is a buffer memory for providing instructions to the processor.

Example embodiment 17 is a method according to one of example embodiments 14 to 16, wherein error code information is stored for the memory contents in the memory and the memory contents in the memory are invalidated by means of a modification of the stored error code information.

Example embodiment 18 is a method according to example embodiment 17, comprising checking on the basis of the stored error code information whether the memory contents read from the memory are valid.

Example embodiment 19 is a method according to example embodiment 18, comprising checking whether the memory contents read from the memory are valid by checking whether the memory contents are error-free according to the stored error code information.

Example embodiment 20 is a method according to example embodiment 19, wherein the application of the reversal of the modification comprises checking whether the memory contents are error-free according to error code information resulting from the stored error code information through application of the reversal of the modification.

Example embodiment 21 is a method according to one of example embodiments 14 to 20, wherein the memory contents are a data block and the first buffer memory and the second buffer memory temporarily store memory contents in data blocks.

Example embodiment 22 is a method according to one of example embodiments 14 to 21, wherein the modification of the memory contents comprises modifying one or more bits of the memory contents or one or more bits of error code information of the memory contents.

Example embodiment 23 is a method according to one of example embodiments 14 to 22, wherein a buffer memory control unit for the first buffer memory has read and write access to the memory and a buffer memory control unit for the second buffer memory has read-only access to the memory.

Example embodiment 24 is a method according to one of example embodiments 14 to 23, wherein the modification is irreversible for a buffer memory control unit for the first buffer memory and is reversible for a buffer memory control unit for the second buffer memory.

Example embodiment 25 is a method according to one of example embodiments 14 to 24, wherein a prediction bit which indicates whether the memory contents have been modified is stored for the memory contents in the memory and the method comprises setting the prediction bit during the reading of the memory contents for storage in the first buffer memory or during the modification of the memory contents.

Example embodiment 26 is a method according to example embodiment 25, wherein a check is carried out on the basis of the stored prediction bit to determine whether the memory contents read from the memory are valid.

It should be noted that all of the aforementioned example embodiments can be combined with one another in any required manner.

Although the invention has been shown and described above all with reference to specific embodiments, it should be understood by those persons who are familiar with the technical field that numerous modifications can be made in respect of the design and details without deviating from the essence and scope of the invention as defined by the following claims. The scope of the invention is therefore defined by the attached claims, and it is intended that all modifications which fall within the meaning or equivalence range of the claims are encompassed.

The invention claimed is:

1. A method for temporarily storing memory contents, comprising:
   during a storage of memory contents from a main memory in a first buffer memory, modifying, by a first buffer memory controller, the memory contents in the main memory so that they are invalidated, wherein the memory contents comprise data;
   reading, by a second buffer memory controller, the memory contents from the main memory for storing the memory contents in a second buffer memory;
   checking, by the second buffer memory controller, whether the memory contents read from the main memory are valid; and
   if the memory contents read from the main memory are invalid, applying, by the second buffer memory controller, a reversal of the modification to the read memory contents.

2. The method as claimed in claim 1, further comprising:
   storing, by the second buffer memory controller, the read memory contents modified by means of the reversal of the modification in the second buffer memory.

3. The method as claimed in claim 1,
   wherein error code information is stored for the memory contents in the main memory, and
   further comprising invalidating, by the first buffer memory controller, the memory contents in the main memory by means of a modification of the stored error code information.

4. The method of claim 3, further comprising:
   checking, by the second buffer memory controller, whether the memory contents read from the main memory are valid, on the basis of the stored error code information.

5. The method of claim 4, wherein the application of the reversal of the modification comprises:
   checking whether the memory contents are error-free according to error code information resulting from the stored error code information through application of the reversal of the modification.

6. The method of claim 1,
wherein the memory contents are a data block,
further comprising temporarily storing, by the first buffer memory and the second buffer memory, memory contents in data blocks.

7. The method of claim 1, wherein the modification is irreversible for the first buffer memory controller and is reversible for the second buffer memory controller.

8. A memory arrangement, comprising:
a main memory;
a first buffer memory;
a first buffer memory controller which is configured, during storage of memory contents from the main memory in the first buffer memory, to invalidate the memory contents in the main memory by means of a modification, wherein the memory contents comprise data;
a second buffer memory; and
a second buffer memory controller which is configured to read the memory contents from the main memory, to check whether the memory contents read from the main memory are valid and, if the memory contents read from the main memory are invalid, to apply a reversal of the modification to the read memory contents.

9. The memory arrangement as claimed in claim 8, wherein the second buffer memory controller is configured to store the read memory contents modified by means of the reversal of the modification in the second buffer memory.

10. The memory arrangement as claimed in claim 8, wherein the memory contents include instructions and data to be processed by means of the instructions, and the first buffer memory is a buffer memory configured to provide data to be processed to a processor and the second buffer memory is a buffer memory configured to provide instructions to the processor.

11. The memory arrangement as claimed in claim 8, wherein error code information is stored for the memory contents in the main memory, and the first buffer memory controller is configured to invalidate the memory contents in the main memory by means of a modification of the stored error code information.

12. The memory arrangement as claimed in claim 11, wherein the second buffer memory controller is configured to check, on the basis of the stored error code information, whether the memory contents read from the main memory are valid.

13. The memory arrangement as claimed in claim 12, wherein the second buffer memory controller is configured to check whether the memory contents read from the main memory are valid by checking whether the memory contents are error free according to the stored error code information.

14. The memory arrangement as claimed in claim 13, wherein the application of the reversal of the modification comprises checking whether the memory contents are error-free according to error code information resulting from the stored error code information through application of the reversal of the modification.

15. The memory arrangement as claimed in claim 8, wherein the memory contents are a data block and the first buffer memory and the second buffer memory are configured to temporarily store memory contents in data blocks.

16. The memory arrangement as claimed in claim 8, wherein the modification of the memory contents comprises modifying one or more bits of the memory contents or one or more bits of error code information of the memory contents.

17. The memory arrangement as claimed in claim 8, wherein the first buffer memory controller has read and write access to the main memory, and the second buffer memory controller has read-only access to the main memory.

18. The memory arrangement as claimed in claim 8, wherein the modification is irreversible for the first buffer memory controller and is reversible for the second buffer memory controller.

19. The memory arrangement as claimed in claim 8, wherein a prediction bit which indicates whether the memory contents have been modified is stored for the memory contents in the main memory, and the first buffer memory controller is configured to set the prediction bit during the reading or modification of the memory contents.

20. The memory arrangement as claimed in claim 19, wherein the second buffer memory controller is configured to check, on the basis of the stored prediction bit, whether the memory contents read from the main memory are valid.

* * * * *